United States Patent
Fuji et al.

(10) Patent No.: US 7,502,252 B2
(45) Date of Patent: Mar. 10, 2009

(54) NONVOLATILE SEMICONDUCTOR MEMORY DEVICE AND PHASE CHANGE MEMORY DEVICE

(75) Inventors: Yukio Fuji, Tokyo (JP); Isamu Asano, Tokyo (JP); Tsuyoshi Kawagoe, Tokyo (JP); Kiyoshi Nakai, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/666,160

(22) PCT Filed: Oct. 25, 2005

(86) PCT No.: PCT/JP2005/019630

§ 371 (c)(1),
(2), (4) Date: Apr. 24, 2007

(87) PCT Pub. No.: WO2006/046579

PCT Pub. Date: May 4, 2006

(65) Prior Publication Data

US 2008/0043522 A1      Feb. 21, 2008

(30) Foreign Application Priority Data

Oct. 26, 2004 (JP) .............................. 2004-311610

(51) Int. Cl.
G11C 11/00    (2006.01)
(52) U.S. Cl. .................... 365/163; 365/100; 365/148
(58) Field of Classification Search .................. 365/163
See application file for complete search history.

(56) References Cited

U.S. PATENT DOCUMENTS

| 5,307,304 | A  |   | 4/1994 | Saito et al. |
| 6,191,972 | B1 |   | 2/2001 | Miura et al. |
| 6,356,477 | B1 | * | 3/2002 | Tran ........................ 365/158 |
| 6,567,296 | B1 |   | 5/2003 | Casagrande et al. |

(Continued)

FOREIGN PATENT DOCUMENTS

JP            4-90189 A       3/1992

(Continued)

OTHER PUBLICATIONS

Japanese Office Action issued in Japanese Patent Application No. JP 2004-311610, mailed Oct. 28, 2008.

*Primary Examiner*—Son L Mai
(74) *Attorney, Agent, or Firm*—McDermott Will & Emery LLP

(57) ABSTRACT

For the purpose of providing a phase change memory device advantageous in layout and operation control by obtaining sufficient write current for high integrated phase change memory devices, the nonvolatile semiconductor memory device of the invention in which word lines and bit lines are arranged in a matrix-shape comprises a select transistor formed at each cross point of the word lines and the bit lines, and a plurality of memory elements commonly connected to the select transistor at one end and connected to a different element select line at an other end and which is capable of writing and reading data. Write and read operations for the selected memory element are controlled by supplying a predetermined current through the select transistor and through the element select line connected to the selected memory element, and the element select lines are arranged in parallel with the bit lines.

10 Claims, 12 Drawing Sheets

U.S. PATENT DOCUMENTS

| | | | |
|---|---|---|---|
| 6,590,807 B2 | 7/2003 | Lowrey | |
| 6,597,598 B1 | 7/2003 | Tran et al. | |
| 6,614,682 B2 * | 9/2003 | Hirai | 365/173 |
| 6,856,536 B2 * | 2/2005 | Rinerson et al. | 365/148 |
| 7,286,378 B2 * | 10/2007 | Nazarian | 365/46 |
| 7,335,907 B2 * | 2/2008 | Terao et al. | 257/2 |
| 2003/0123281 A1 | 7/2003 | Iwata et al. | |
| 2004/0114428 A1 | 6/2004 | Morikawa | |
| 2004/0125648 A1 | 7/2004 | Iwata | |
| 2004/0184331 A1 | 9/2004 | Hanzawa et al. | |
| 2006/0176724 A1 * | 8/2006 | Asano et al. | 365/105 |
| 2008/0025070 A1 * | 1/2008 | Horii et al. | 365/148 |

FOREIGN PATENT DOCUMENTS

| | | |
|---|---|---|
| JP | 2000-315382 | 11/2000 |
| JP | 2003-257177 A | 9/2003 |
| JP | 2003-323791 A | 11/2003 |
| JP | 2004-186553 A | 7/2004 |
| JP | 2004-206796 A | 7/2004 |
| WO | WO 03/065377 A1 | 8/2003 |

* cited by examiner

NONVOLATILE SEMICONDUCTOR MEMORY DEVICE AND PHASE CHANGE MEMORY DEVICE

RELATED APPLICATIONS

This application is the U.S. National Phase under 35 U.S.C. § 371 of International Application No. PCT/JP2005/019630, filed on Oct. 25, 2005, which in turn claims the benefit of Japanese Application No. 2004-311610, filed on Oct. 26, 2004, the disclosures of which Applications are incorporated by reference herein.

TECHNICAL FIELD

The present invention relates to a nonvolatile semiconductor memory device including memory elements and select transistors each having a large gate width capable of obtaining sufficient write current, and more particularly, relates to a phase change memory device including phase change memory elements as the memory elements.

BACKGROUND ART

In recent years, mobile devices using various types of information have become popular, and the importance of a nonvolatile memory device such as a flash memory has increased. The nonvolatile memory device which is to be a future mainstream is required to have features such as large capacity, high speed and inexpensiveness, and representative candidates for such a memory are FeRAM, MRAM and the like. Among these devices, a phase change memory device which is one of nonvolatile memories utilizing structure change of phase change material has been studied and developed as a promising technique. In the phase change memory device, heat is applied to chalcogenide-based phase change material (germanium, antimony and tellurium) so as to change between a high-resistance amorphous state and a low-resistance crystalline state, and thereby realizing the nonvolatile memory device in which data is rewritably stored. When data is written to the phase change memory device, current caused by applying a predetermined pulse flows therein and thereby Joule heat is generated so that temperature of the phase change material is changed. By appropriately controlling the current level and pulse application time, it is possible to freely change between the amorphous state and the crystalline state. Generally, the write time for the phase change memory device requires from several tens to hundred ns.

For the purpose of realizing a high-integrated phase change memory device, a phase change memory device employing a cross point memory cell array system is proposed, in which memory cells are arranged at cross points of word lines and bit lines. Such a cross point memory cell array system is disclosed in Patent documents 1 and 2, for example. As described therein, in order to obtain sufficient current when writing data, a configuration is employed in which bipolar transistors or diode devices are used in memory cells, substituting for select transistors. Generally, when memory cells are formed using bipolar transistors, it is possible to reliably obtain the current for generating the Joule heat required for writing data.

Patent Document 1: U.S. Pat. No. 6,590,807 B2
Patent Document 2: U.S. Pat. No. 6,567,296 B1

DISCLOSURE OF INVENTION

Problems to be Solved by the Invention

However, increase in area of each memory cell is inevitable in the configuration forming memory cells using bipolar transistors as in the above-mentioned conventional phase change memory device, as compared with the general configuration forming memory cells using MOS transistors. Meanwhile, the configuration forming memory cells using MOS transistors is effective in reducing the area of each memory cell, but has a problem in passing a sufficient current for writing data. That is, it is known that about 800 µA is required for the write current in the phase change memory device, and the gate width of the MOS transistors needs to be increased to pass such a large current through the MOS transistors. In this case, the required gate width of the MOS transistor is about four times as large as a gate width of a MOS transistor used in recent general process. Thus, since the gate width of the MOS transistor is required to be increased to obtain the sufficient write current, it is difficult to highly integrate the phase change memory device.

It is an object of the present invention to provide a phase change memory device in which a large number of phase change memory elements are highly integrated on a semiconductor substrate, and sufficient write current is obtained by using select transistors each having a large gate width, so that a phase change memory device advantageous in plane layout and operation control is realized.

Means for Solving the Problems

An aspect of the present invention is a nonvolatile semiconductor memory device in which a plurality of word lines and a plurality of bit lines are arranged in a matrix-shape on a semiconductor substrate, comprising: a select transistor which is formed at each cross point of the word lines and the bit lines and controls a current flowing through corresponding one of the bit lines by potential of corresponding one of the word lines; a plurality of memory elements each of which is commonly connected to said select transistor at one end and connected to a different element select line at an other end and which is capable of writing and reading data; and current control means for controlling write and read operations for selected said memory element by supplying a predetermined current through said select transistor to be controlled and through said element select line connected to said memory element selected from said plurality of memory elements connected to said select transistor, wherein said element select lines are arranged in parallel with said bit lines on the semiconductor substrate.

According to the nonvolatile semiconductor memory device of the present invention, a unit circuit composed of a single select transistor and a predetermined number of memory elements is arranged at each cross point of a plurality of word lines and a plurality of bit lines, so that a pseudo cross point memory cell array is formed. Then, control is properly performed for the word lines, the bit lines and the element select lines connected to respective memory elements, and it is thereby possible to selectively supply a desired current to a targeted memory element in write/read operation. In this case, since the number of select transistors is smaller than that of the memory elements, the gate width can be easily increased so as to supply sufficient write current to achieve a structure suitable for high integration. Further, since the element select lines and the bit lines are arranged in parallel with each other, a structure advantageous in layout and control, for example, a configuration in which circuits related to the word lines and other circuits are arranged separately can be realized, which is advantageous in plane layout and operation control.

In the nonvolatile semiconductor memory device of the present invention, said memory element may be a phase change memory element which rewritably stores data by changing between a low-resistance crystalline state and a high-resistance amorphous state.

In the nonvolatile semiconductor memory device of the present invention, said phase change memory element may be formed of chalcogenide-based phase change material including germanium, antimony and tellurium.

In this manner, when the phase change memory device (for example, a GST device including germanium, antimony and tellurium) is used as the memory device, since a particularly large write current is required, it is possible to combine a single select transistor with a predetermined number (for example, four) of phase change memory elements. By such a structure, a configuration in which the select transistor has a large gate width is realized and it is possible to obtain sufficient write current.

In the nonvolatile semiconductor memory device of the present invention, said plurality of memory elements may be arranged in a line in a direction of the word lines within a range of the gate width of said select transistor.

In the nonvolatile semiconductor memory device of the present invention, in write operation for said selected memory element, said current control means may selectively output a reset pulse for changing said memory element to the amorphous state and a set pulse for changing said memory element to the crystalline state.

In the nonvolatile semiconductor memory device of the present invention, in read operation for said selected memory element, said current control means may switch potential of said element select line connected to said memory element to ground level.

In the nonvolatile semiconductor memory device of the present invention, said current control means may switch said element select lines except said element select line connected to said selected memory element to a pre-charge voltage.

An aspect of the present invention is a phase change memory device in which a plurality of word lines and a plurality of bit lines are arranged in a matrix-shape on a semiconductor substrate, comprising: a select transistor which is formed at each cross point of the word lines and the bit lines and controls a current flowing through corresponding one of the bit lines by potential of corresponding one of the word lines; a plurality of phase change memory elements each of which is commonly connected to said select transistor at one end and connected to a different element select line at an other end and which is capable of writing and reading data by changing between a low-resistance crystalline state and a high-resistance amorphous state; and current control means for controlling write and read operations for selected said phase change memory element by supplying a predetermined current through said select transistor to be controlled and through said element select line connected to said phase change memory element selected from said plurality of phase change memory elements connected to said select transistor.

In the phase change memory device of the present invention, said phase change memory element may be formed of chalcogenide-based phase change material including germanium, antimony and tellurium.

In the phase change memory device of the present invention, in write operation for said selected phase change memory element, said current control means may selectively output a reset pulse for changing said phase change memory element to the amorphous state and a set pulse for changing said phase change memory element to the crystalline state.

[Effect of the Invention]

According to the present invention, a pseudo cross point memory cell array is configured by combining a select transistor and a predetermined number of memory elements, and a required current can be supplied by controlling an element select line in write/read operation for a selected memory element, so that a structure in which a plurality of memory devices shares a select transistor having a large gate width. By this, particularly when using phase change memory elements, it is possible to allow both high integration and supply of sufficient write current. Further, since the element select lines and the bit lines are arranged in parallel with each other on a semiconductor substrate, the nonvolatile semiconductor memory device advantageous in layout of a chip and in operation control can be realized.

DESCRIPTION OF SYMBOLS

Figure 1:
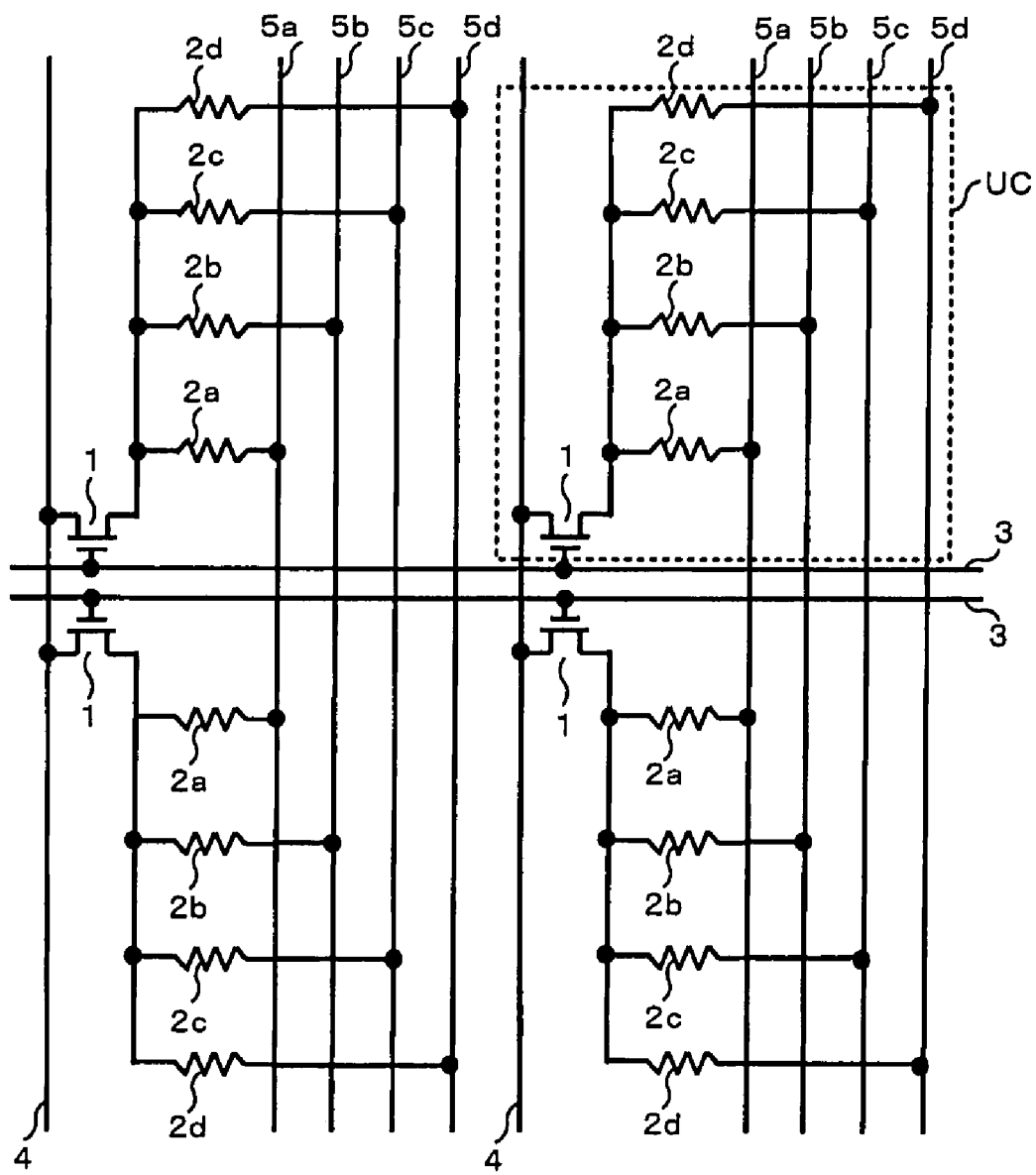
FIG. 1 is a diagram showing a basic circuit configuration of a phase change memory device employing a pseudo cross point memory cell array of the present invention.

1 . . . select transistor
2 . . . GST element
3 . . . word line
4 . . . bit line
5 . . . element select line
6 . . . diffusion layer
7 . . . through hole
8 . . . lower electrode 9 ... plug
10, 20 ... write amplifier
11 ... bit line select transistor
21 ... element select transistor
30 ... sense amplifier
31 ... switch
UC ... unit circuit
C1, C2 ... circuit portion

BEST MODE FOR CARRYING OUT THE INVENTION

An embodiment of the present invention will be described below with reference to accompanying drawings. In this embodiment, a case in which the invention is applied to a phase change memory device as a nonvolatile semiconductor memory device configured to write and read data using phase change memory elements.

FIG. 1 is a diagram showing a basic circuit configuration of the phase change memory device of the invention which employs a pseudo cross point memory cell array. In FIG. 1, a unit circuit UC is composed of a select transistor 1 and four GST elements 2 commonly connected to the source of the select transistor 1. The four GST elements 2 are assumed to be arranged in the order of GST elements 2a, 2b, 2c and 2d from the closer side to the select transistor 1. The entire circuit of the phase change memory device is configured by regularly arranging a large number of unit circuits UC each having the same configuration. In FIG. 1, a circuit portion including four unit circuits UC of the entire circuit of the phase change memory device is shown.

The select transistor 1 is a MOS transistor in which current flowing between its source and drain can be controlled by the gate potential, and a word line 3 is connected to the gate while a bit line 4 is connected to the drain. In the entire phase change memory device formed on a semiconductor substrate, for example, n word lines 3 and m bit lines 4 are arranged in a matrix-shape, and total n×m unit circuits UC are arranged at cross points to constitute an entire memory cell array.

The GST element 2 is a phase change memory element formed of germanium, antimony and tellurium which are chalcogenide-based phase change material, and functions as a resistance element which rewritably stores 1-bit data corresponding to a state of high resistance or low resistance. Therefore, the four GST elements 2a to 2d connected to the single select transistor 1 store 4-bit data. When rewriting the data stored in the GST element 2, it is required to apply a predetermined pulse for changing between a high-resistance amorphous state and a low-resistance crystalline state, and descriptions thereof will be given later.

The four GST elements 2a to 2d are commonly connected at their one ends to the source of the select transistor 1, while being connected at their other ends to different element select lines 5. In other words, the GST element 2a is connected to an element select line 5a, the GST element 2b is connected to an element select line 5b, the GST element 2c is connected to an element select line 5c, and the GST element 2d is connected to an element select line 5d. Thus, by controlling the potential of each of the element select lines 5a to 5d separately, it is possible to perform write/read operation for each of the GST elements 2a to 2d individually.

Figure 2:
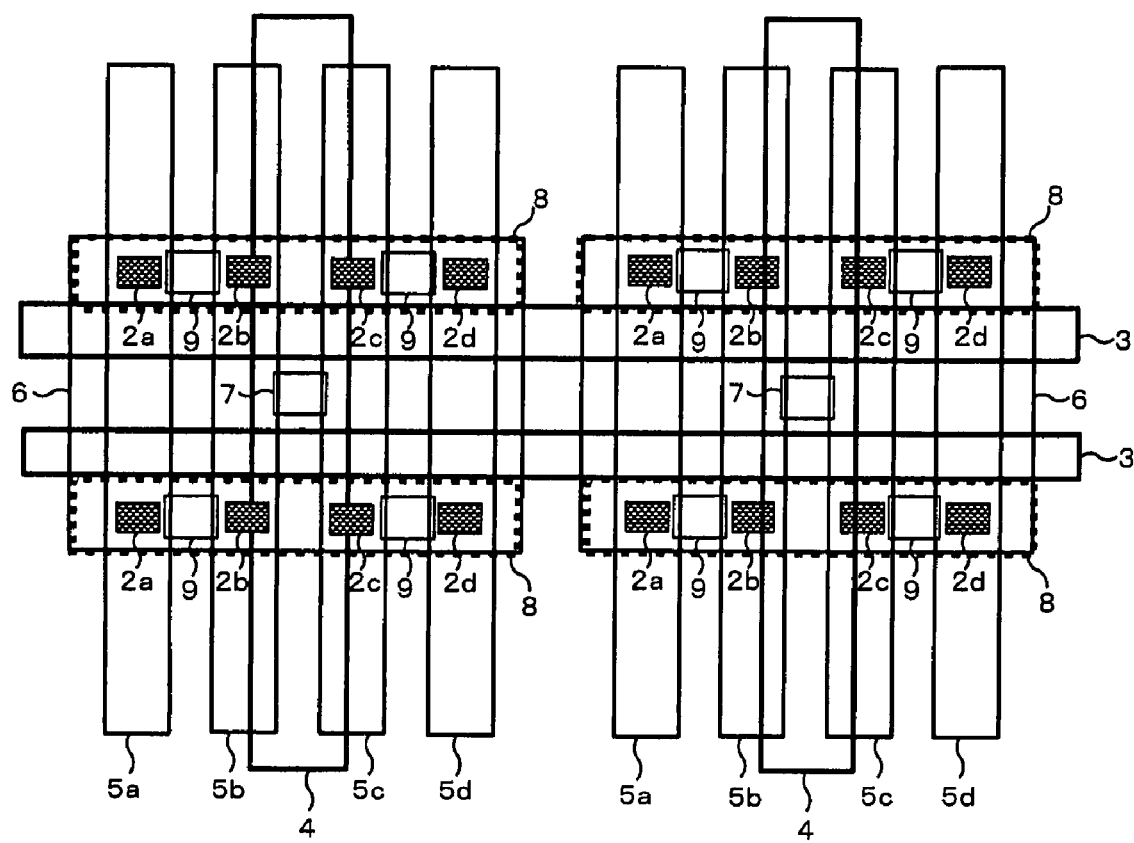
FIG. 2 is a diagram showing a layout of the phase change memory device formed using a semiconductor process.

A layout of the phase change memory device of this embodiment will be described below with reference to FIG. 2. FIG. 2 shows an area including four unit circuits UC corresponding to the circuit portion of FIG. 1, which is included in the layout of the phase change memory device formed on the semiconductor substrate using a semiconductor process.

First, diffusion layers 6 are formed on rectangular areas on the semiconductor substrate. Two diffusion layers 6 are shown in FIG. 2, and each diffusion layer 6 corresponds to respective select transistors 1 of two unit circuits UC. Adjacent diffusion layers 6 are isolated by an element isolation area, and spaced with a predetermined gap.

Two word lines 3 are arranged over the diffusion layers 6 via an insulating film. Each word line 3 functions as a gate electrode of the select transistor 1. Bit lines 4 formed using metal wiring are arranged in a direction perpendicular to the word lines 3. Each bit line 4 is connected to a drain position of the diffusion layer 6 (a position between two word lines 3) via a through hole 7.

The four GST elements 2a to 2d are formed over the diffusion layers 6 and the bit lines 4 at both sides between which two word lines 3 exist in a range overlapping one diffusion layer 6. A common lower electrode 8 is formed under the four GST elements 2a to 2d, and is connected to source positions (at both sides between which two word lines 3 exist) of the diffusion layer 6 via two plugs 9. In a range of a single diffusion layer 6, a symmetrical structure is formed with respect to two word lines 3, and eight GST elements 2, two lower electrodes 8 and four plugs 9 are formed.

Four element select lines 5a to 5d are arranged over the four GST elements 2a to 2d. A pair of GST elements 2a located symmetrically with respect to two word lines 3 is connected to the element select line 5a via plugs (not shown) respectively. Similarly, a pair of GST elements 2b is connected to the element select line 5b, a pair of GST elements 2c is connected to the element select line 5c, and a pair of GST elements 2d is connected to the element select line 5d, via plugs respectively.

Here, the four element select lines 5a to 5d are arranged in parallel with the bit line 4. Therefore, in the entire layout of the phase change memory device, each bit line 4 and the four element select lines 5a to 5d are arranged alternately in a predetermined direction, and each word line 3 is arranged in a perpendicular direction. In a range corresponding to the gate width defined in the direction of the word line 3 in the diffusion layer 6, the four GST elements 2a to 2d are arranged in a line in the direction of the word line 3. By this, the MOS transistor formed in the diffusion layer 6 has a large gate width capable of providing sufficient write current for the four GST elements 2a to 2d.

Figure 3:
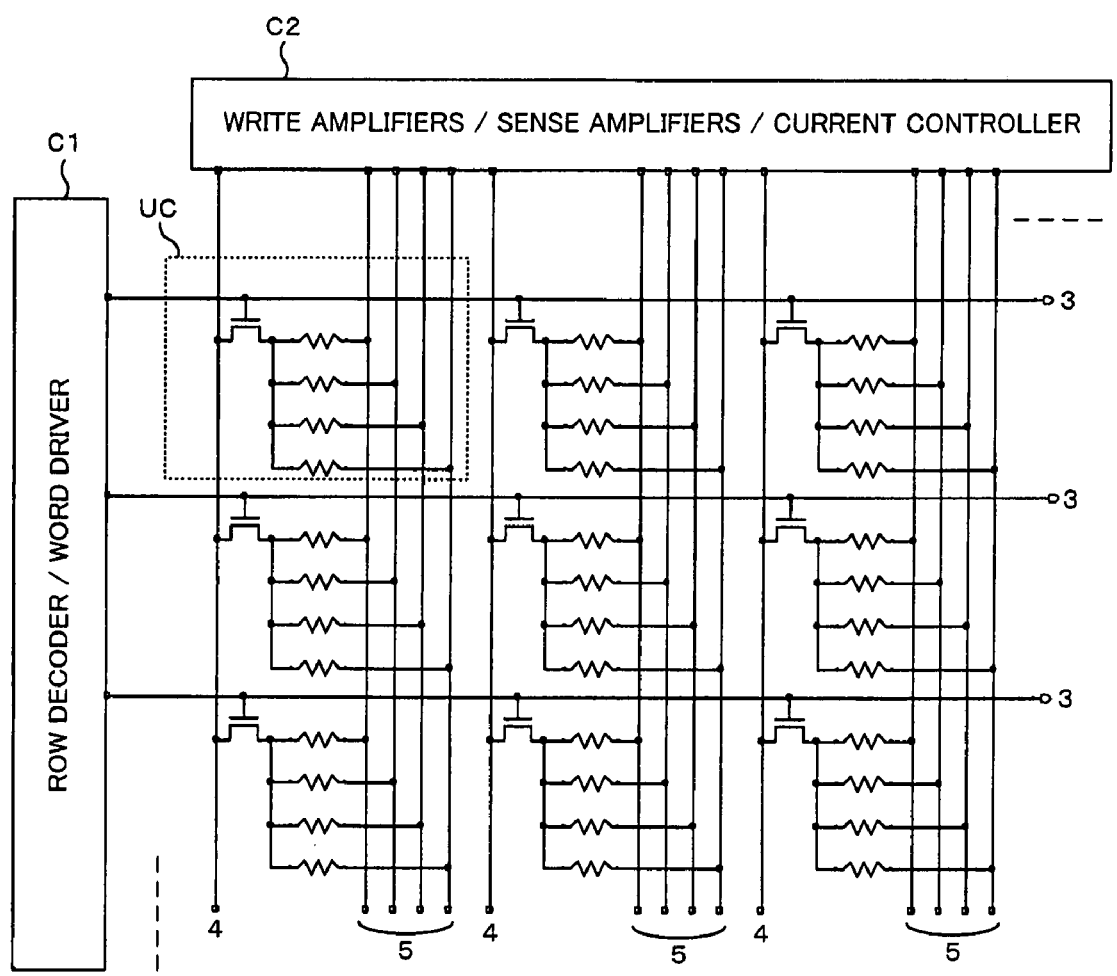
FIG. 3 is a diagram of an entire configuration of the phase change memory device in which a memory cell array is configured by arranging a plurality of word lines and a plurality of bit lines in a matrix-shape on a semiconductor substrate using the basic circuit configuration of FIG. 1.

FIG. 3 is a diagram of the entire configuration of the phase change memory device in which the memory cell array is configured by arranging a plurality of word lines 3 and a plurality of bit lines 4 in a matrix-shape on the semiconductor substrate using the basic circuit configuration of FIG. 1. A plurality of unit circuits UC included in the memory cell array is placed at cross points of the plurality of word lines 3 and the plurality of bit lines 4. The plurality of word lines 3 is arranged in the horizontal direction in FIG. 3, and a circuit portion C1 including a row decoder, a word driver and the like is provided at one end of the word lines 3. The plurality of bit lines 4, and a plurality of element select lines 5 each four of which composes a group, are arranged in the vertical direction in FIG. 3, and a circuit portion C2 including a sense amplifier unit, a write amplifier unit, a current controller and the like is provided at one end of the bit lines 4 and the element select lines 5. Specific operation of the sense amplifier, the write amplifier and the like included in the circuit portion C2 will be described later.

According to the configuration of this embodiment, the bit lines 4 and the element select lines 5 are arranged in parallel with each other, and the word lines 3 are arranged in perpendicular to the bit lines 4 and the element select lines 5. Therefore, it is possible to separate the circuit portion C1 corresponding to the word lines 3 from the other circuit portion C2, so that an appropriate circuit scale can be achieved. Further, to control selecting and driving the word lines 3, current supplied to the bit lines 4 and current supplied to the element select lines 5 are separately controlled, and it is thereby possible to promptly perform the write/read operation for the semiconductor memory device such as the phase change memory device.

Figure 4:
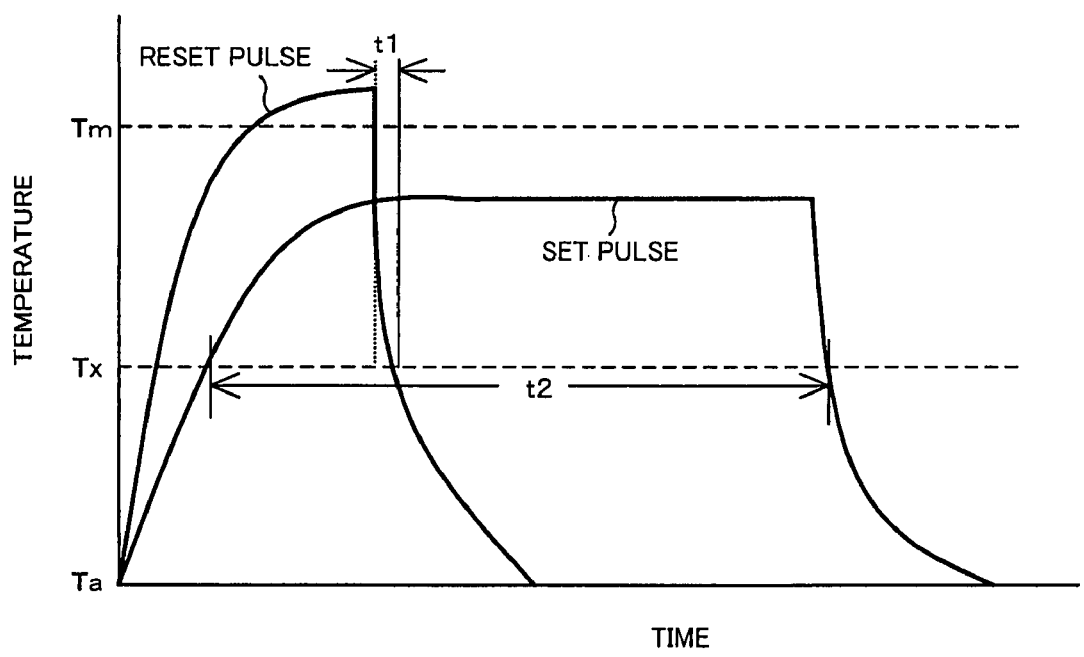
FIG. 4 is a diagram showing simulation waveforms of applied pulses when write operation for a general GST device is performed.

Next, operation of the phase change memory device of this embodiment will be described below. FIG. 4 is a diagram showing simulation waveforms of applied pulses when the write operation for the general GST element 2 is performed. In FIG. 4, changes in temperature of the GST element 2 are shown, in which a reset pulse for changing the GST element 2 to a high-resistance amorphous state and a set pulse for changing the GST element 2 to a low-resistance crystalline state are applied to the GST element 2.

The reset pulse has a pulse waveform to apply a large current capable of melting the GST element 2 for a short time. When the reset pulse is applied to the GST element 2 for writing data, the GST element 2 is heated to a temperature Tm or higher by the generated heat due to the large current, and thereafter the GST element 2 is rapidly cooled within a time t1. Thereby, the GST element 2 becomes in a state having a reset resistance value corresponding to the amorphous state.

Meanwhile, the set pulse has a pulse waveform to apply a current of normal magnitude capable of moderately heating the GST element 2 for a relatively long time. When the set pulse is applied to the GST element 2 for writing data, the GST element 2 maintains a state in a temperature Tx or higher for a time t2. Thereby, the crystallization of the GST element 2 proceeds, and the GST element 2 becomes in a state having a set resistance value corresponding to the crystalline state.

As shown in FIG. 4, by properly controlling the amount of heating of the GST element 2 when applying the set and reset pulses, i.e. a current value, the cooling time t1 and the heating time t2, it is possible to change the resistance state of the GST element 2 using the phase change. In this case, in order to optimize the amount of heating of the GST element 2, it is required to design a heater (heating means) such as a plug for connecting the GST element 2 so as to have an appropriate resistance value.

Figure 5:
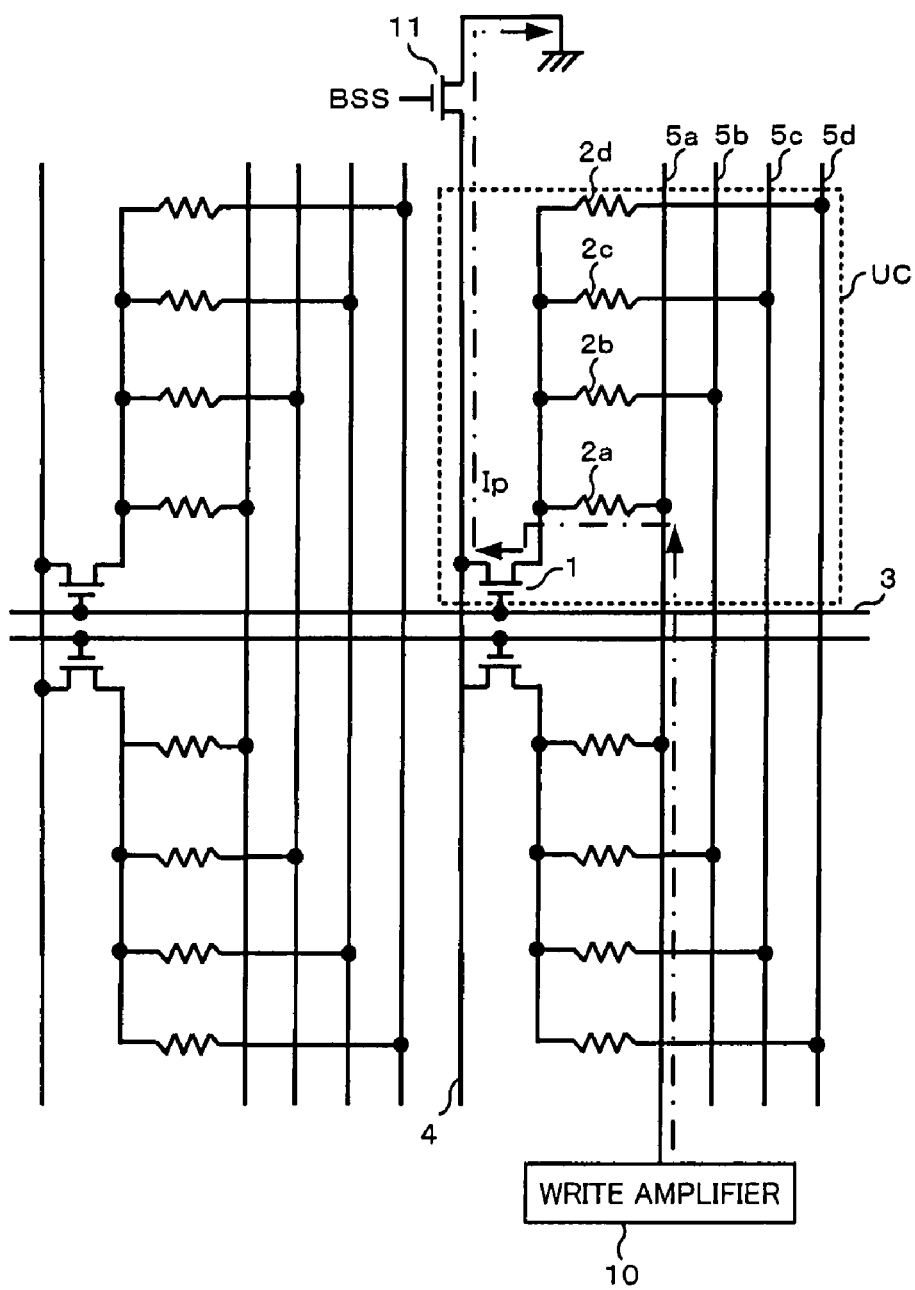
FIG. 5 is a circuit diagram to which components required for the write operation are added on the basis of the circuit configuration of FIG. 1 to explain the write operation for the phase change memory device of the embodiment.

Next, the write operation for the phase change memory device of this embodiment will be described below. FIG. 5 is a circuit diagram to which components required for the write operation are added on the basis of the circuit configuration of FIG. 1. FIG. 5 shows a state in which a write current Ip flows when bit data is written to one GST element 2a targeted for writing in an arbitrary unit circuit UC. As can be seen from FIG. 5, among components in FIG. 1, the element select line 5a, the GST element 2a, the select transistor 1 selected by the word line 3, and the bit line 4 exist on a current path of the write current Ip. The write current Ip is supplied from a write amplifier 10 through the element select line 5a. The bit line 4 through which the write current Ip flows is selected by a bit line select transistor 11.

In addition, the write amplifier 10 is connected to the other element select lines 5b to 5d as well as the element select line 5a. In the circuit portion C2 of FIG. 3, a plurality of write amplifiers 10 and a plurality of bit line select transistors 11 are provided.

In FIG. 5, a bit line select signal BSS is input to the gate of the bit line select transistor 11. When the bit line select signal BSS becomes high level, the potential of the bit line 4 becomes ground level through the bit line select transistor 11. The select transistor 1 to which the bit line 4 of the ground level is connected is maintained off when the word line 3 is at low level, while being turned on so as to be in a selected state when the word line 3 is at high level. A write voltage Vp is applied to the element select line 5a from the write amplifier 10. The voltage value and the application time of the write voltage Vp is controlled so as to obtain the write current Ip adapted to either the set operation or the reset operation for the GST element 2a targeted for writing.

Three element select lines 5b, 5c and 5d which are not targeted for writing and are adjacent to the targeted element select line 5a maintain an opening state or a predetermined pre-charge voltage is applied thereto so that the phase change of the three GST elements 2b, 2c and 2d not targeted for writing does not occur.

When the select transistor 1 becomes on at a timing when the word line 3 rises from low level to high level, the write current Ip starts flowing along the path indicated by a dotted line in FIG. 5. This write current Ip flows along the element select line 5a and flows into the bit line 4 through the GST element 2a and the select transistor 1. At this point, the GST element 2a is heated by the Joule heat generated by the flowing write current Ip so that the phase change occurs, and thereby data writing can be performed by changing between the high-resistance amorphous state and the low-resistance crystalline state.

Figure 6:
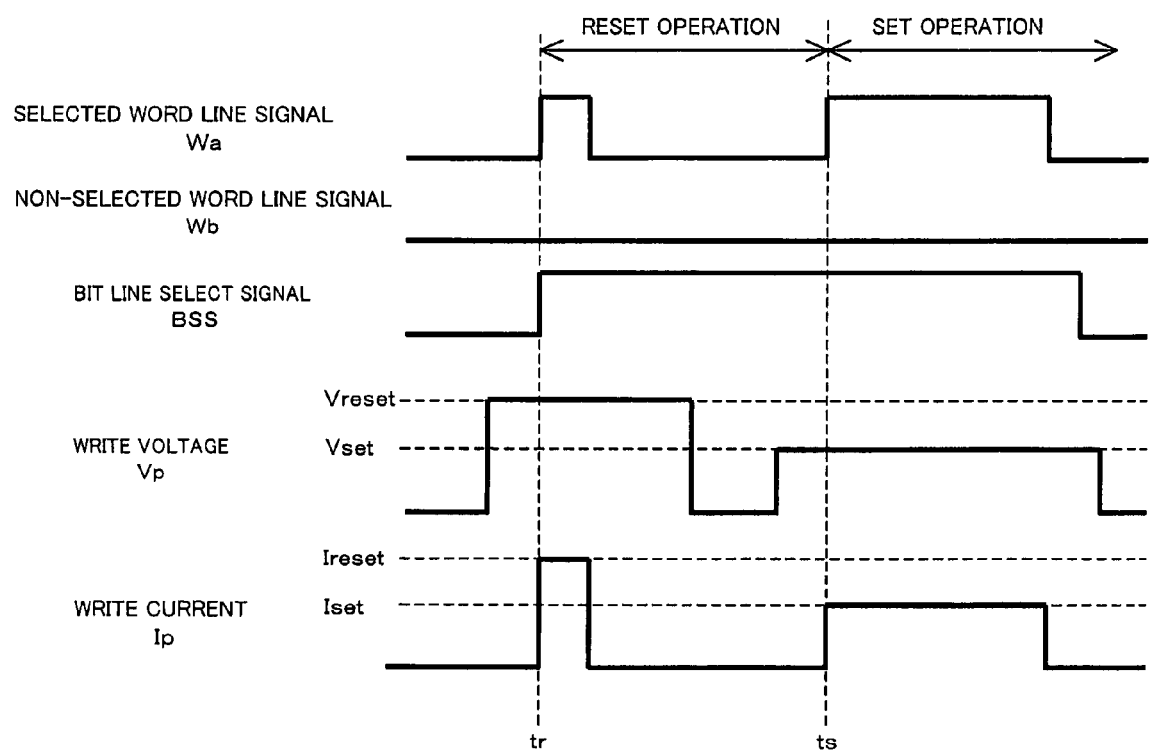
FIG. 6 is an operation waveform diagram corresponding to the circuit configuration of the phase change memory device of FIG. 5.

FIG. 6 is an operation waveform diagram corresponding to the circuit configuration of the phase change memory device of FIG. 5. In FIG. 6, operation waveforms in a case of writing operation including the set and reset operations, in which the reset operation is first performed and thereafter the set operation is performed. First, in the reset operation, the write voltage Vp output from the write amplifier 10 rises to a voltage value Vreset required for the reset operation prior to a timing tr. It is necessary to set the voltage value Vreset based on a current value Ireset determined corresponding to FIG. 4 by calculating the resistance value of the entire current path in consideration of characteristics of the GST element 2a and losses such as parasitic resistances of the select transistor 1 and the bit line 4.

At the timing tr, the bit line select signal BSS changes to high level, and the bit line 4 falls to the ground level through the bit line select transistor 11. At the same time, a selected word line signal Wa corresponding to the selected word line 3 rises with a short pulse width corresponding to the reset pulse, and the select transistor 1 is turned on so that the write current Ip having the above-mentioned current value Ireset flows. As shown in FIG. 6, a non-selected word line signal Wb corresponding to the other word line 3 adjacent to the selected word line 3 is maintained at low level.

The GST element 2a is melted by the Joule heat generated by the write current Ip, and thereafter immediately, the word line 3 changes from high level to low level, so that the select transistor 1 is turned off and the current path of the write current Ip is blocked. Thereby, the melted GST element 2a is rapidly cooled so as to be changed to the high-resistance amorphous state, and the reset operation is completed.

Next, in the set operation, the write voltage Vp output from the write amplifier 10 rises to a voltage value Vset required for the set operation prior to a timing ts. it is also necessary to set the voltage value Vset based on a current value Iset determined corresponding to the characteristics in FIG. 4 as in the case of the above-mentioned voltage value Vreset. In the example of FIG. 6, the bit line select signal BSS always maintains high from the timing tr to the timing ts and thereafter.

At the timing ts, the selected word line signal Wa rises with a relatively long pulse width corresponding to the set pulse, and the select transistor 1 is turned on so that the write current Ip having the above-mentioned current value Iset flows. The GST element 2a holds the Joule heat generated by the write current Ip for the time t2 (FIG. 4), and thereafter the word line 3 changes from high level to low level, so that the select transistor 1 is turned off and the current path of the write current Ip is blocked. Thereby, the GST element 2a is heated so as to be changed to the low-resistance crystalline state, and the set operation is completed.

In addition, when write operation is performed for the other GST elements 2b to 2d connected to the select transistor 1 to which the GST element 2a targeted for writing is commonly connected, the same control as described above can be performed for element select lines 5b to 5d respectively connected thereto. In other words, the write voltage Vp is applied to each of the element select lines 5b to 5d so that the Joule heat is generated by the write current Ip flowing through each of the GST elements 2b to 2d and the select transistor 1, and it is thereby possible to perform write operation for the GST elements 2b to 2d individually.

Meanwhile, when a plurality of select transistors 1 connected to the same word line 3 is not selected for writing, corresponding element select lines 5a to 5d are controlled to be open or to be maintained at the ground level. Even when the select transistors 1 are turned on in this state, the GST elements 2a to 2d maintain a state in which current does not flow.

In the case when the phase change memory device has functions such as multi-bit write operation, high-speed write operation or page write operation, it leads to a situation in which a large number of select transistors 1 on the same word line 3 are selected at the same time. In this case, data writing can be performed collectively by applying the write voltage Vp to the element select lines 5a to 5d connected to the targeted GST elements 2a to 2d at the same time.

Figure 7:
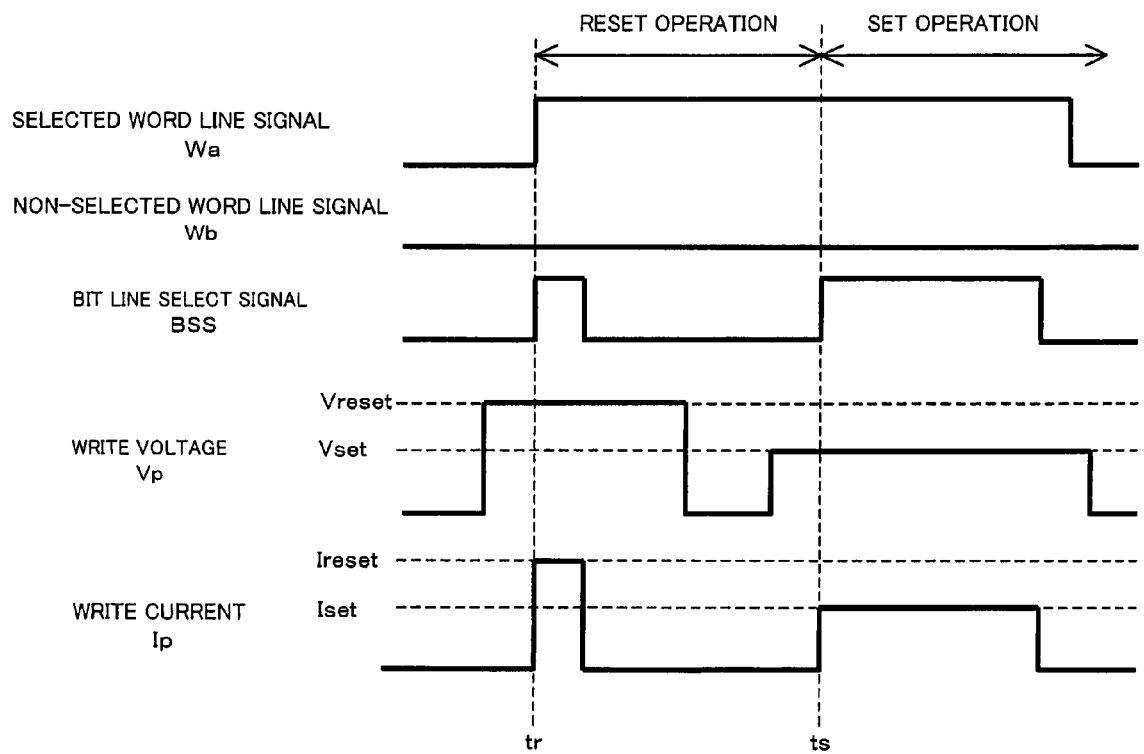
FIG. 7 is a modification in which a selected word line signal Wa and a bit line select signal BSS are changed in the operation waveform diagram of FIG. 6.

The aforementioned write operation is not limited to the circuit configuration and operation as described above, and various modifications can be applied. FIG. 7 shows a modification in which the selected word line signal Wa and the bit line select signal BSS are changed in the operation waveform diagram of FIG. 6. An application time of the pulse to supply the write current Ip is controlled depending on the selected word line signal Wa in the example of FIG. 6, while controlled depending on the bit line select signal BSS in the example of FIG. 7. Thus, in FIG. 7, the selected word line signal Wa maintains a state of high after the timing tr, as in the bit line select signal BSS of FIG. 6. In this case, waveforms of the write voltage Vp and the write current Ip are the same as in FIG. 6.

Figure 8:
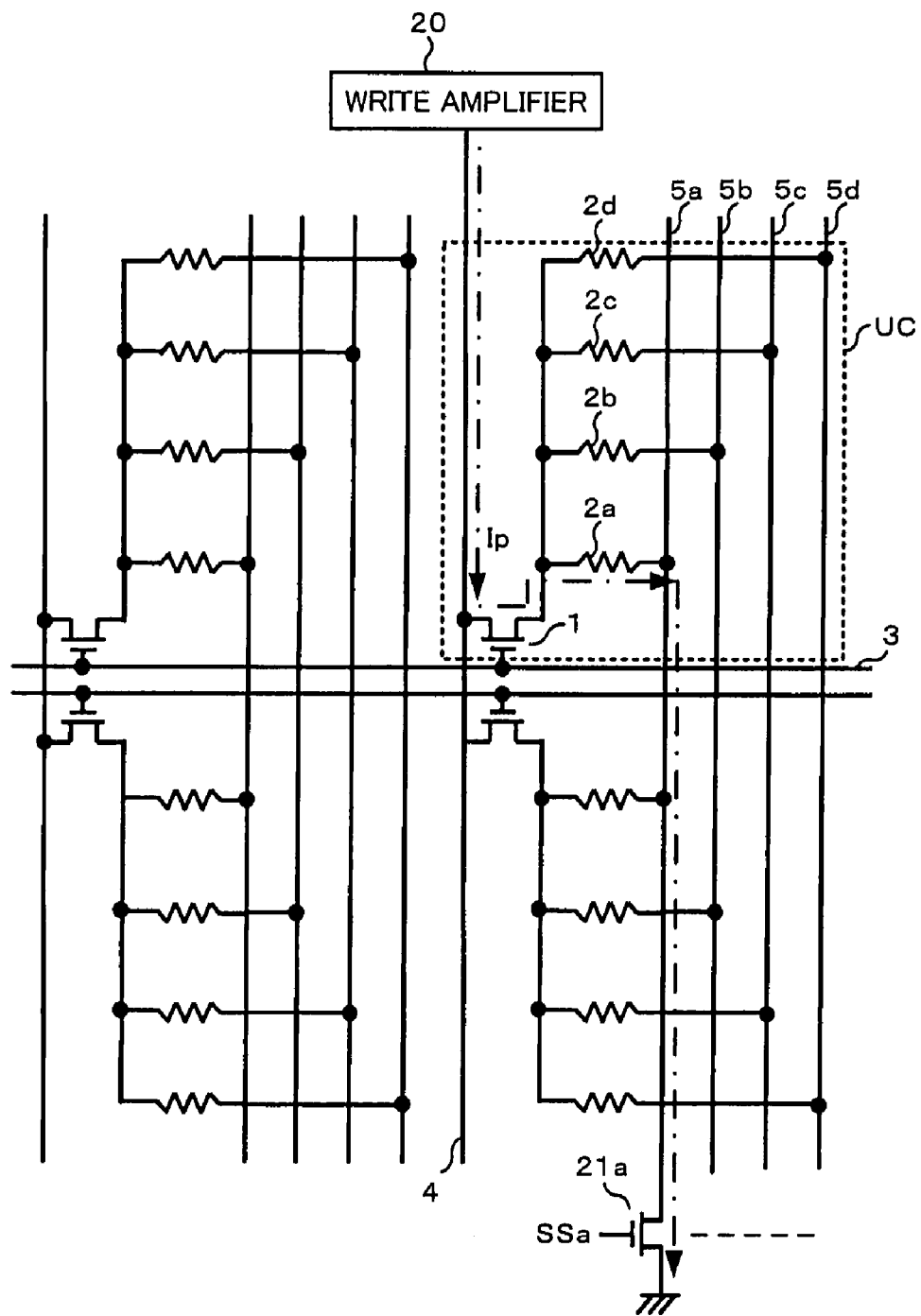
FIG. 8 is another modification having a configuration in which a write current Ip flows in the reverse direction in the circuit configuration of FIG. 5.

FIG. 8 shows another modification having a configuration in which the write current Ip flows in the reverse direction in the circuit configuration of FIG. 5. In FIG. 8, a write amplifier 20 is connected to the bit line 4 and supplies the write current Ip to the targeted GST element 2a. Further, an element select transistor 21a, to the gate of which an element select signal SSa is input, is connected to the element select line 5a. In addition, element select transistors 21b to 21d, to the gates of which element select signals SSb to SSd are input, are similarly connected to the other element select lines 5b to 5d respectively, which are not shown in FIG. 8.

Figure 9:
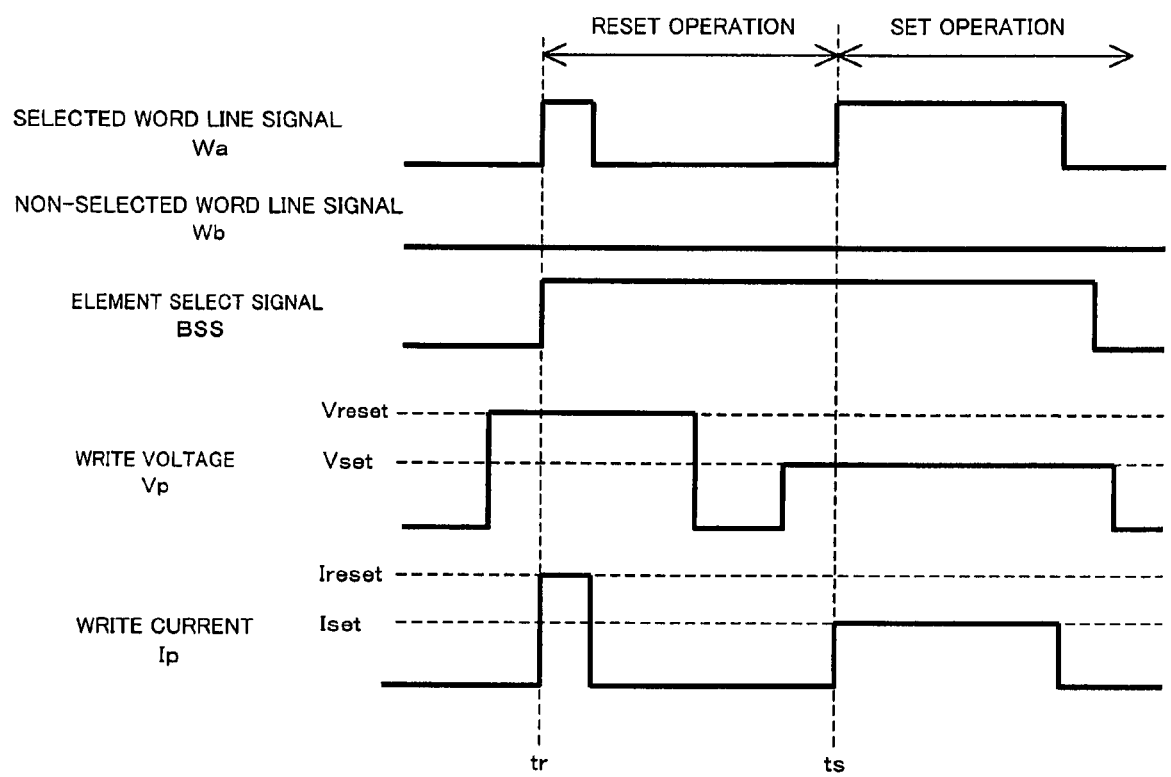
FIG. 9 is an operation waveform diagram corresponding to the circuit configuration of FIG. 5.

FIG. 9 is an operation waveform diagram of this modification corresponding to the circuit configuration of FIG. 8. In FIG. 9, the element select signal SSa changes as in the bit line select signal BSS of FIG. 6 in the reset operation for the GST element 2a of FIG. 8. That is, the element select signal SSa changes to high level at the timing tr, the element select line 5a falls to the ground level through the element select transistor 21a, and this state is maintained. By this, in a state in which the word line 3 is at low level, the write current Ip flows in the reverse direction to the case of FIG. 5 as shown in FIG. 8. Other control may be performed in the same way as in the case of FIG. 6.

Figure 10:
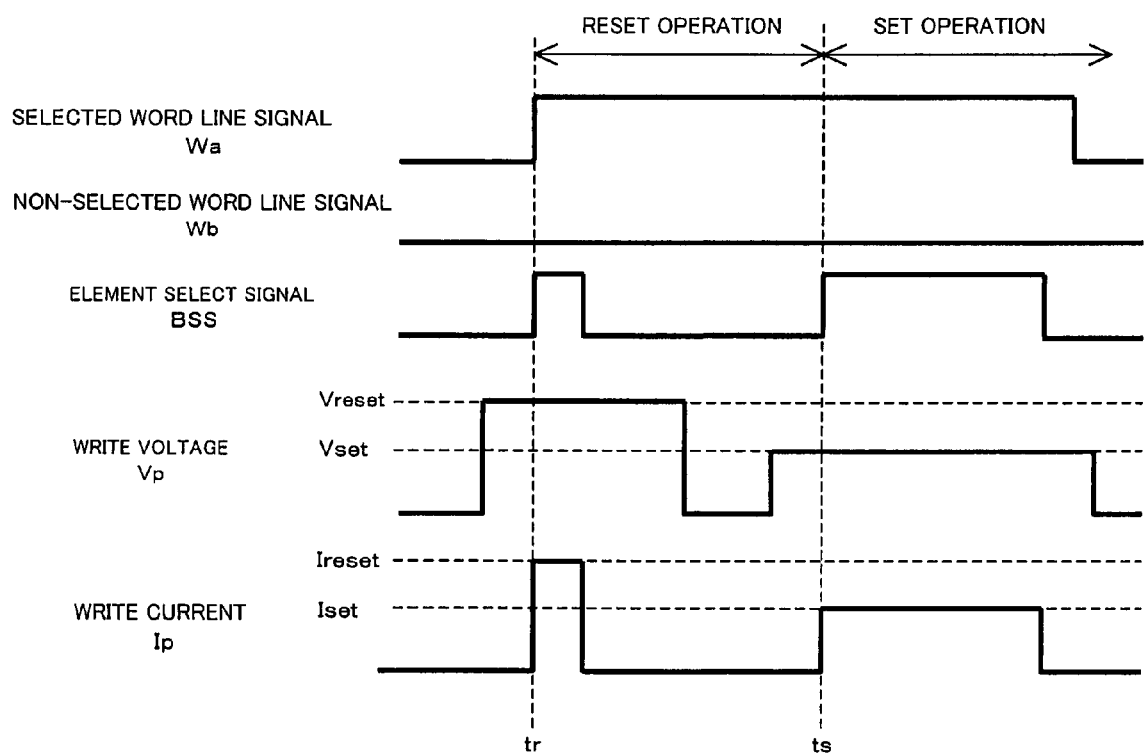
FIG. 10 is an operation waveform diagram in which control for the selected word line signal Wa and an element select signal SSa is changed in the operation waveform diagram of FIG. 9.

FIG. 10 is an operation waveform diagram in which control for the selected word line signal Wa and the element select signal SSa is changed in the operation waveform diagram of FIG. 9 in this modification from the same viewpoint as in FIG. 7. Also in the case of performing such control, it is possible to supply the same write current Ip as in the case of FIG. 9.

Figure 11:
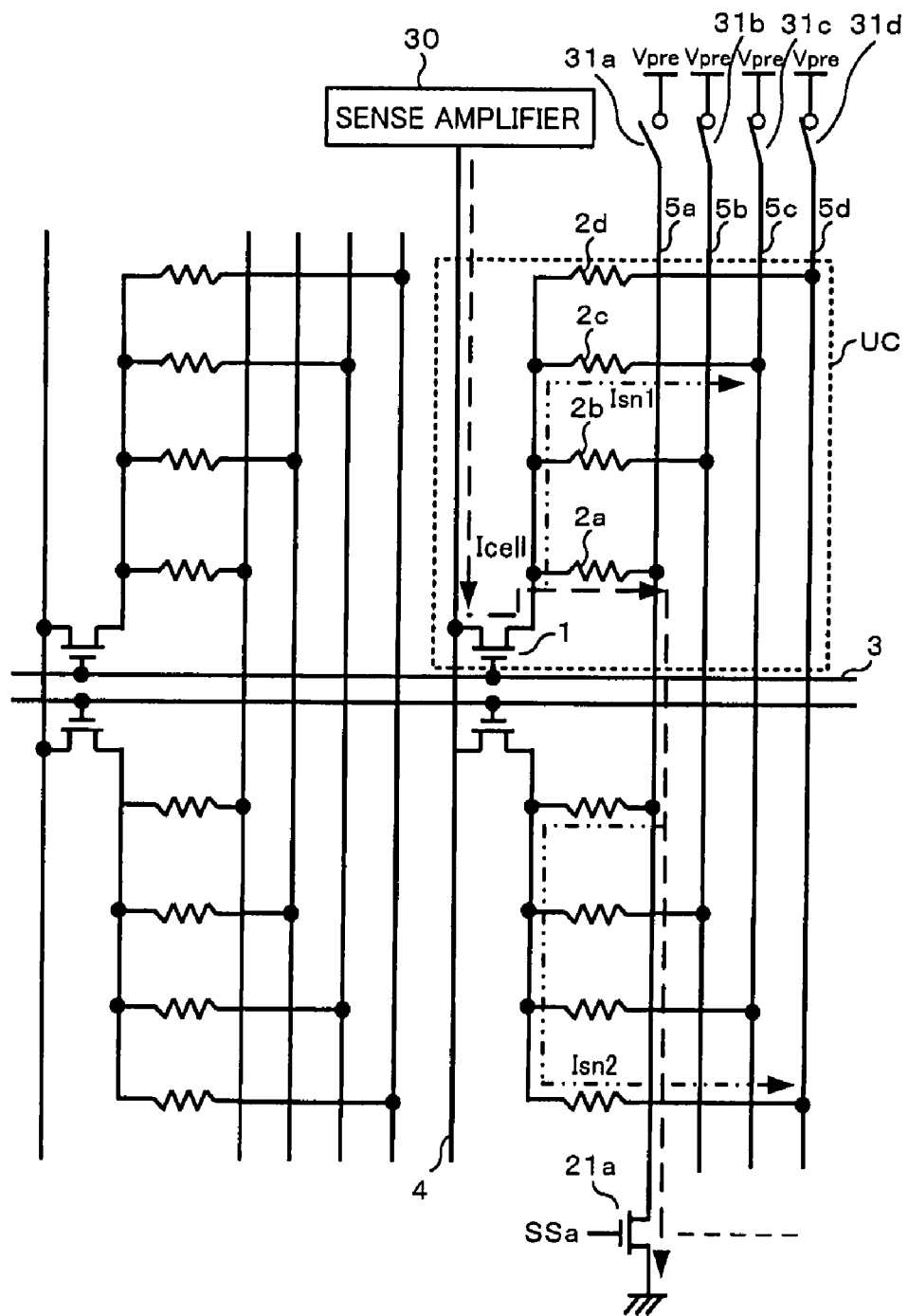
FIG. 11 is a circuit diagram to which components required for read operation are added on the basis of the circuit configuration of FIG. 1 to explain the read operation for the phase change memory device of the embodiment.

Next, the read operation for the phase change memory device of this embodiment will be described below. FIG. 11 is a circuit diagram to which components required for the read operation are added on the basis of the circuit configuration of FIG. 1. FIG. 11 shows a cell current Icell flowing through the GST element 2 (GST element 2a is shown in the example of FIG. 11) targeted for reading, and sneak currents Isn (two sneak currents Isn1 and Isn2 are shown in the example of FIG. 11) flowing through other GST elements 2, when bit data is read from the single GST element 2a targeted for reading. In the circuit configuration of FIG. 11, a sense amplifier 30 connected to the bit line 4 and switches 31a to 31d respectively connected to the element select lines 5a to 5d are added, but the other components are the same as in the circuit configuration of FIG. 8.

In FIG. 11, when the GST element 2a storing written data is selected and read, the element select signal SSa is changed to high level in a state of maintaining the word line 3 at high level, and thereby the element select line 5a falls to the ground level. In this state, the cell current Icell is supplied to the GST element 2a from the sense amplifier 30. The cell current Icell flows along a current path as shown in FIG. 1, and flows into the GST element 2a targeted for reading through the bit line 4 and the select transistor 1. Then, different bit data corresponding to the resistance state of the GST element 2a can be read by the sense amplifier 30.

Here, the switches 31b to 31d are connected to the element select lines 5b to 5d to which the GST elements 2b to 2d not targeted for reading are connected respectively, and a pre-charge voltage Vpre having the same potential as that of the bit line 4 is applied to the GST elements 2b to 2d by turning the switches 31b to 31d on. The switch 31a connected to the element select line 5a is off. The application of the pre-charge voltage Vpre prevents the read operation from being difficult, in which the sneak currents Isn1 are generated due to decrease in the potential of the bit line 4 when the GST elements 2b to 2d become states of the low set resistance value.

Further, also when each GST elements 2a to 2d connected to the select transistor 1 in a non-selected state is in the state of the low set resistance value on one of the element select lines 5a to 5d, it is necessary to prevent the read operation from being difficult due to the generation of the sneak currents Isn2. Therefore, it is required to optimize the resistance value of the GST element 2, and an optimal design based on the relationship between the resistance value and the cell current, particularly, between the reset resistance value corresponding to the amorphous state and the cell current Icell is desirable.

Figure 12:
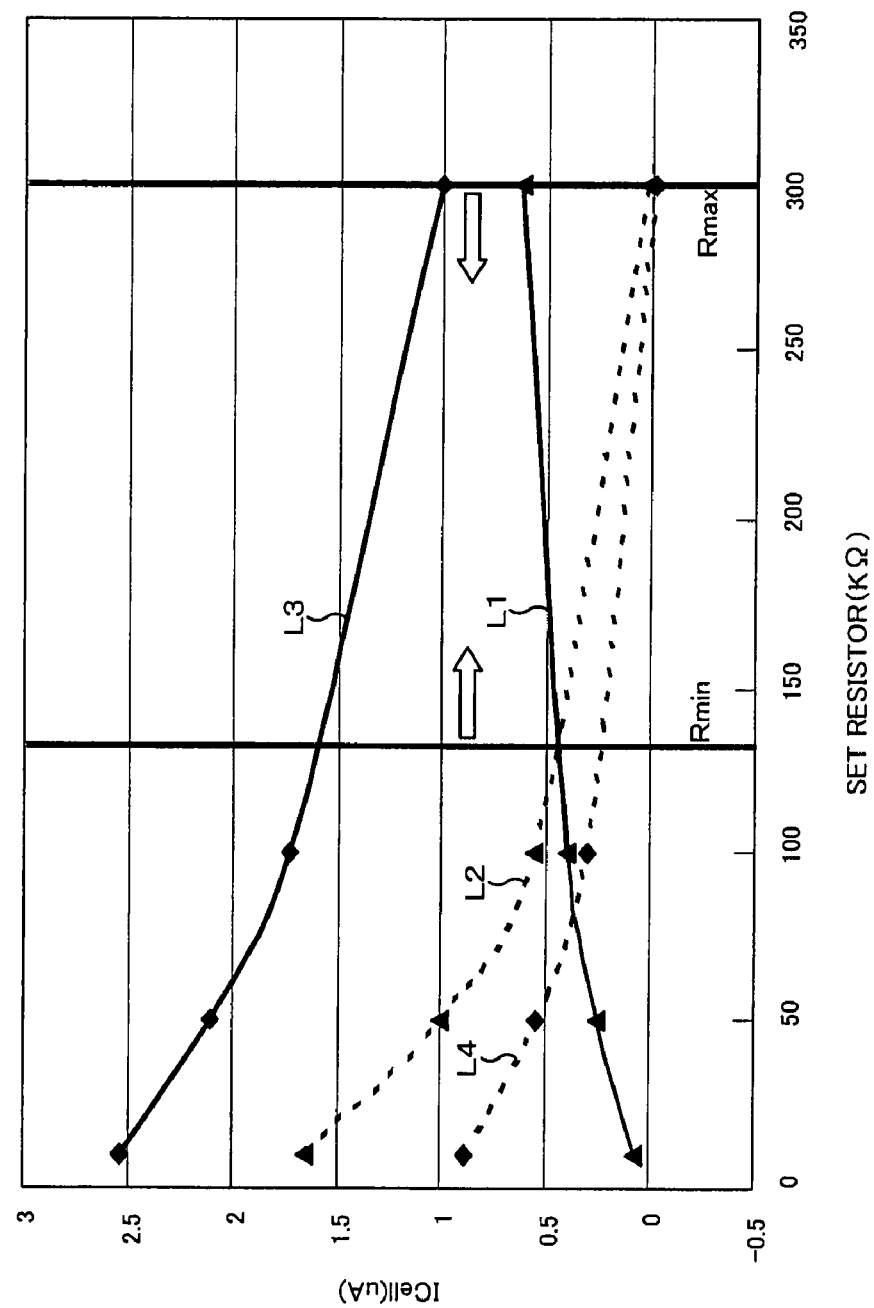
FIG. 12 is a diagram showing a relationship between a resistance value of the GST element 2 set for the entire phase change memory device, and a cell current Icell and a sneak current Isn each flowing through a selected select transistor in the read operation.

FIG. 12 is a diagram showing a relationship between the resistance value of the GST element 2 set for the entire phase change memory device, and the cell current Icell and the sneak current Isn each flowing through the selected select transistor 1 in the read operation, in order to derive design conditions for the resistance value of the GST element 2. In FIG. 12, changes in the cell current Icell are shown in comparison between the low set resistance value (crystalline state) and the high reset resistance value (amorphous state) of the GST element 2 targeted for reading. Under the same comparison conditions, changes in the sneak current Isn flowing through an adjacent GST element 2 not targeted for reading are shown.

In FIG. 12, a case of the maximum sneak current Isn is assumed, and it is further assumed that all GST elements 2 except the GST element 2 targeted for reading are in the state of having the set resistance value. The same set resistance value is set for all the GST elements 2 irrespective of whether or not the GST element 2 is targeted for reading, and the reset resistance value is assumed to be set at 500 kΩ for the GST element 2 targeted for reading having the reset resistance value.

A state in which the GST element 2 targeted for reading has the reset resistance value will be considered first. In this case, a change in the cell current Icell flowing in the GST element 2 targeted for reading through the select transistor 1 is indicated by a solid line L1, and a change in the sneak current Isn flowing in the adjacent GST element 2 having the set resistance value is indicated by a dotted line L2. With reference to the solid line L1 in FIG. 12, as the set resistance value is set smaller, the cell current Icell tends to decrease. At this point, in a range where the set resistance value exceeds approximately 130 kΩ, the sneak current Isn of the dotted line L2 is maintained at a relatively small value. Thus, when the GST element 2 has the reset resistance value, even if the effect of the sneak current Isn is taken into account, the cell current Icell can be detected by the sense amplifier 30. In contrast thereto, in a range where the set resistance value falls below approximately 130 kΩ, the sneak current Isn increases to such an extent that erroneous detection occurs in the sense amplifier 30, and it becomes difficult to accurately read stored data from the GST element 2 targeted for reading having the reset resistance value. In view of the foregoing, the resistance value of approximately 130 kΩ is considered to be a lower limit of the set resistance value, and is set as a minimum set resistance value Rmin shown in FIG. 12.

A state in which the GST element 2 targeted for reading has the set resistance value will be considered next. In this case, a change in current flowing in the GST element 2 targeted for reading through the select transistor 1 is indicated by a solid line L3, and a change in current flowing in the adjacent GST element 2 having the set resistance value is indicated by a dotted line L2. With reference to the solid line L3 in FIG. 12, as the set resistance value is set smaller, the cell current Icell tends to increase. The large cell current Icell of 2.5 μA is obtained when the set resistance value is 20 kΩ, and the cell current Icell of approximately 1 μA is obtained even when the set resistance value is increased to 300 kΩ. However, when the set resistance value is 300 kΩ, current margin is about 0.5 μA for the cell current Icell when the GST element 2 targeted for reading has the reset resistance value. Accordingly, when the set resistance value is further increased, the current margin is further decreased, and it becomes difficult to distinguish between the set and reset resistance values so as to cause a problem in reading. In view of the foregoing, the resistance value of approximately 300 kΩ is considered to be an upper limit of the set resistance value, and is set as a maximum set resistance value Rmax shown in FIG. 12.

As described above, the resistance value of the GST element 2 is determined depending on the Joule heat generated by the write current Ip, the cooling time t1 and the heating time t2. Therefore, by setting pulse application conditions corresponding to two states for the high reset resistance value and the low set resistance value, it is possible to control the resistance value to be a desired value. Accordingly, in terms of the aforementioned consideration, the pulse application conditions can be set such that the set resistance value is in a range approximately from 150 kΩ to 300 kΩ for the reset resistance value of 500 kΩ.

In the foregoing, although the present invention is described specifically based on the embodiment, the present invention is not limited to the aforementioned embodiment, and is capable of being carried into practice with various modifications without departing from the subject matter thereof. For example, although the unit circuit UC of the phase change memory device of the above-mentioned embodiment is composed of four GST elements 2, the number of GST elements 2 is not limited to four, and may be increased to 8, 16 or 32. In this case, since there is a risk that read speed is reduced due to increase in the sneak current or the like, it is desirable to employ an optimal configuration for a system to which the phase change memory device is applied. Further, if the sneak current becomes a problem, by employing a configuration in which a diode is placed between the GST element 2 and the element select line 5 using amorphous silicon or the like, it is possible to neglect the effect of the sneak current.

Moreover, when employing the circuit configuration as shown in FIG. 1 and the layout as shown in FIG. 2, the memory element is not limited to the GST element 2, and the present invention is also applicable when using other phase change memory elements or other resistance elements.

INDUSTRIAL APPLICABILITY

As described above, the nonvolatile semiconductor memory device of the present invention can be applied to a nonvolatile semiconductor memory device using phase change memory elements and the like mounted on a variety of electronic devices, and is suitable for high integration and supplying sufficient write current.

The invention claimed is:

1. A nonvolatile semiconductor memory device comprising:

first and second regions formed in parallel to each other to define a first channel region therebetween;

a first word line formed over the first channel region with an intervention of a first gate insulating film therebetween, the first word line extending in a first direction;

a first bit line extending in a second direction crossing the first direction, the first bit line crossing over the first and second regions and the first word line and having an electrical contact with the first region;

a plurality of first element select lines extending in parallel to each other in the second direction, each of the first element select lines crossing over the first and second regions and the first word line; and a plurality of first memory elements, each of the first memory elements being disposed at an intersection of an associated one of the first element select lines and the second region and having electrical contacts with the associated one of the first element select lines and the second region.

2. The nonvolatile semiconductor memory device as claimed in claim 1, further comprising:

a third region formed in parallel to the first region to define a second channel region;

a second word line formed over the second channel region with an intervention of a second gate insulating film therebetween, the second word line extending in the first direction; and a plurality of second memory elements, wherein each of the first bit line and the first element select lines further extending in the second direction to cross over the third region and the second word line, each of the second memory elements beind disposed at an intersection of an associated one of the first element select lines and the third region and having electrical contacts with the associated one of the first element select lines and third region.

3. The nonvolatile semiconductor memory device as claimed in claim 2, wherein the first and second regions and a part of the first word line constitutes a first MOS transistor and the first and third regions and a part of the second word line constitutes a second MOS transistor, the first MOS transistor being connected between the first bit line and each of the first memory elements and having a gate connected to the first word line and the second MOS transistor being connected between the first bit line and each of the second memory elements and having a gate connected to the second word line.

4. The nonvolatile semiconductor memory device as claimed in claim 1, wherein the first bit line runs between adjacent ones of the first element select lines.

5. A phase change memory device comprising:
first and second regions formed in parallel to each other to define a first channel region therebetween;
a first word line formed over the first channel region with an intervention of a first gate insulating film therebetween, the first word line extending in a first direction;
a first bit line extending in a second direction crossing the first direction, the first bit line crossing over the first and second regions and the first word line and having an electrical contact with the first region;
a first lower electrode formed over the second region with an electrical contact with the second region;
a plurality of first element select lines extending in parallel to each other in the second direction, each of the first element select lines crossing over the first region, the first lower electrode and the first word line; and
a plurality of first phase change memory elements, each of the first phase change memory elements being disposed at an intersection of an associated one of the first element select lines and the first lower electrode and representing one of a low-resistance state and a high-resistance state for storing data.

6. The phase change memory device as claimed in claim 5, further comprising:
third and fourth regions formed in parallel to each other to define a second channel region therebetween, the third and fourth regions being arranged in line respectively with the first and second regions in the first direction and the second channel region being covered with the first word line with an intervention of a second gate insulating film;
a second bit line extending in the second direction, the second bit line crossing over the third and fourth regions and the first word line and having an electrical contact with the third region;
a second lower electrode formed over the fourth region and having an electrical contact with the fourth region;
a plurality of second element select lines extending in parallel to each other in the second direction, each of the second element select lines crossing over the third region, the second lower electrode and the first word line; and
a plurality of second phase change memory elements, each of the second phase change memory elements being disposed at an intersection of an associated one of the second element select lines and the second lower electrode and representing one of a low-resistance state and a high-resistance state for storing data.

7. The phase change memory device as claimed in claim 6, wherein the first bit line runs between adjacent ones of the first element select lines and the second bit line runs between the adjacent ones of the second element select lines.

8. The phase change memory device as claimed in claim 5, wherein the first lower electrode has a plurality of electrical contacts with the second region, the electrical contacts being arranged in line in the first direction.

9. The phase change memory device as claimed in claim 6, wherein the first lower electrode has a plurality of first electrical contacts with the second region and the second lower electrode has a plurality of second electrical contacts with the fourth regions, the first electrical contacts being arranged in line in the first direction and the second electrical contacts being arranged in line in the first direction.

10. The phase change memory device as claimed in claim 6, wherein the first and second regions and a part of the first word line constitutes a first MOS transistor and the third and fourth regions and a part of the first word line constitutes a second MOS transistor, the first MOS transistor being connected between the first bit line and each of the first phase change memory elements and having a gate connected to the first word line and the second MOS transistor being connected between the second bit line and each of the second phase change memory elements and having a gate connected to the first word line.

* * * * *